US008230406B2

(12) United States Patent
Carbone et al.

(10) Patent No.: US 8,230,406 B2
(45) Date of Patent: Jul. 24, 2012

(54) COMPILER OPTION CONSISTENCY CHECKING DURING INCREMENTAL HARDWARE DESIGN LANGUAGE COMPILATION

(75) Inventors: Richard L. H. Carbone, Hyde Park, NY (US); Gabor Bobok, Schenectady, NY (US); Gabor Drasny, Poughkeepsie, NY (US); Ali El-Zein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1353 days.

(21) Appl. No.: 11/530,495

(22) Filed: Sep. 11, 2006

(65) Prior Publication Data

US 2008/0127130 A1 May 29, 2008

(51) Int. Cl.
*G06F 9/45* (2006.01)
(52) U.S. Cl. .................. 717/145; 717/136; 717/140
(58) Field of Classification Search .................. None
See application file for complete search history.

(56) References Cited

U.S. PATENT DOCUMENTS

| | | | | |
|---|---|---|---|---|
| 5,230,050 A * | 7/1993 | Iitsuka et al. | | 717/145 |
| 5,301,260 A | 4/1994 | Miyashita | | 395/54 |
| 5,490,249 A | 2/1996 | Miller | | 395/183.14 |
| 5,652,835 A | 7/1997 | Miller | | 395/183.14 |
| 6,275,976 B1 | 8/2001 | Scandura | | 717/1 |
| 6,295,517 B1 * | 9/2001 | Roy et al. | | 703/15 |
| 6,308,320 B1 * | 10/2001 | Burch | | 717/154 |
| 6,427,234 B1 * | 7/2002 | Chambers et al. | | 717/140 |
| 7,236,918 B2 * | 6/2007 | Roesner et al. | | 703/14 |
| 7,823,091 B2 * | 10/2010 | Dennison et al. | | 716/102 |
| 2003/0046671 A1 * | 3/2003 | Bowen | | 717/141 |
| 2007/0028208 A1 * | 2/2007 | Maki | | 717/106 |
| 2007/0169033 A1 * | 7/2007 | Metzgen | | 717/140 |
| 2007/0245323 A1 * | 10/2007 | Bertelrud | | 717/140 |

OTHER PUBLICATIONS

Flexible Consistency Checking; Christian Nentwich et al.; University College London—United Kingdom and Ernst Ellmer—Zuhlke Engineering GmbH-Germany; pp. 1-36; ACM Transactions on Software Engineering & Methodology; vol. 12, No. 1, Jan. 2003.
Jan Scheffczyk et al.; "Consistent Document Engineering" Formalizing Type-safe Consistency Rules for Heterogeneous Repositories; Doc. Eng '03; Nov. 20-22, 2003; Grenoble, France, Copyright 2003; ACM 1-58113-724-9/03/0011.
Sarita V. Adve, Member IEEE, Vijay S. Pai; Student Member, IEEE and Parthasarathy Ranganathan, Student Member, IEEE; Adve et al.; Advances in Memory Consistency models pages; Proceedings of the IEEE; vol. 87; No. 3; Mar. 1999.

* cited by examiner

*Primary Examiner* — Insun Kang
(74) *Attorney, Agent, or Firm* — Cantor Colburn LLP; John Campbell

(57) ABSTRACT

Method, system, and program product for processing hardware design language code to facilitate reuse of compiled code units including options and option values in compiled code units. The method includes the steps of grouping options and option values to determine if code controlled by them will be reused; and determining options and option values that would permit and prevent reuse of compiled code units.

16 Claims, 2 Drawing Sheets

COMPILER OPTION CONSISTENCY CHECKING DURING INCREMENTAL HARDWARE DESIGN LANGUAGE COMPILATION

BACKGROUND

1. Field of the Invention

The invention described herein relates generally to the development, maintenance, and installation of software programs by using operations on a computer to enable a user to create and manage computer program code, e.g., hardware description language program code. At a high level this includes maintaining software modules or files, integrating source code, and source code version management, as well as establishing that integrated program code modules demonstrates certain desirable properties. These properties include consistency to enable reuse of previously compiled units, thereby facilitating reuse.

2. Background Art

When compiling hardware design language source code (e.g., VHDL, Verilog) that consists of several modules or compilation units, it might be advantageous to reuse the results of previous compiler runs. This is especially the case for compilation units or modules in time consuming applications, such as logic synthesis. The prior art tools use the time date stamp check to ensure that the pre-compiled results are up to date, that is, that the stored results were created from the latest source files.

The problems arise because if the pre-compiled modules are up-to-date, there might be inconsistencies caused by one or more of:

1. Different compiler options used when compiling these modules:
2. Different environmental options defined on the command line that effect the output of the compiler. For example, the environmental variables can be used to conditionally include or omit constructs from the source code. These environmental variables are defined on the command line for the compiler and can be treated as an option to the compiler that takes a set of values.

For example, in a logic synthesis environment, a piece of the hierarchy could be compiled register scan chain inserted and the other portion not, resulting in a misfunctional output.

Thus, a clear need exists for an automated process of storing and retrieving options and their values from compiled units, ensuring safe reuse of pre-compiled units. These options are grouped in sets, named consistency rules, which are either user defined or hard coded inside the compiler. These consistency rules constitute the basis on which pre-compiled units will be reused or not.

SUMMARY OF THE INVENTION

In this disclosure, we describe an automated process of storing and retrieving options and their values from compiled units, ensuring safe reuse of pre-compiled units. Options are grouped in sets, named consistency rules, which are either user defined or hard coded inside the compiler. These consistency rules constitute the basis on which pre-compiled units will be reused or not. Users are able to control which options are those that would prevent the compiler from reusing pre-compiled source files if the compiler options used when compiling them differed from the current option values for these options. This will result in compilation time reduction without risking misfunctional output due to conflicting options.

The difficulties of the prior art are obviated by the disclosed method, system, and program product for of processing hardware design language code. The hardware design language code is characterized by the presence of consistency rules, including options and option values in compiled code units. These consistency rules facilitate reuse of compiled code units by grouping options and option values to determine if code controlled by them will be reused; and determining options and option values that controllably permit and prevent reuse of compiled code units. These options and option values may be user defined or pre-coded. This comprises determining options and option values that would permit reuse of compiled code units if previously compiled options are consistent with current option values, and prevent reuse of compiled code units if previously compiled options differ from current values.

BRIEF DESCRIPTION OF THE DRAWINGS

The subject matter which is regarded as the invention is particularly pointed out and distinctly claimed in the claims at the conclusion of the specification The foregoing and other objects, features, and advantages of the invention are apparent from the following detailed description taken in conjunction with the accompanying drawings in which:

DETAILED DESCRIPTION OF THE INVENTION

Figure 1:
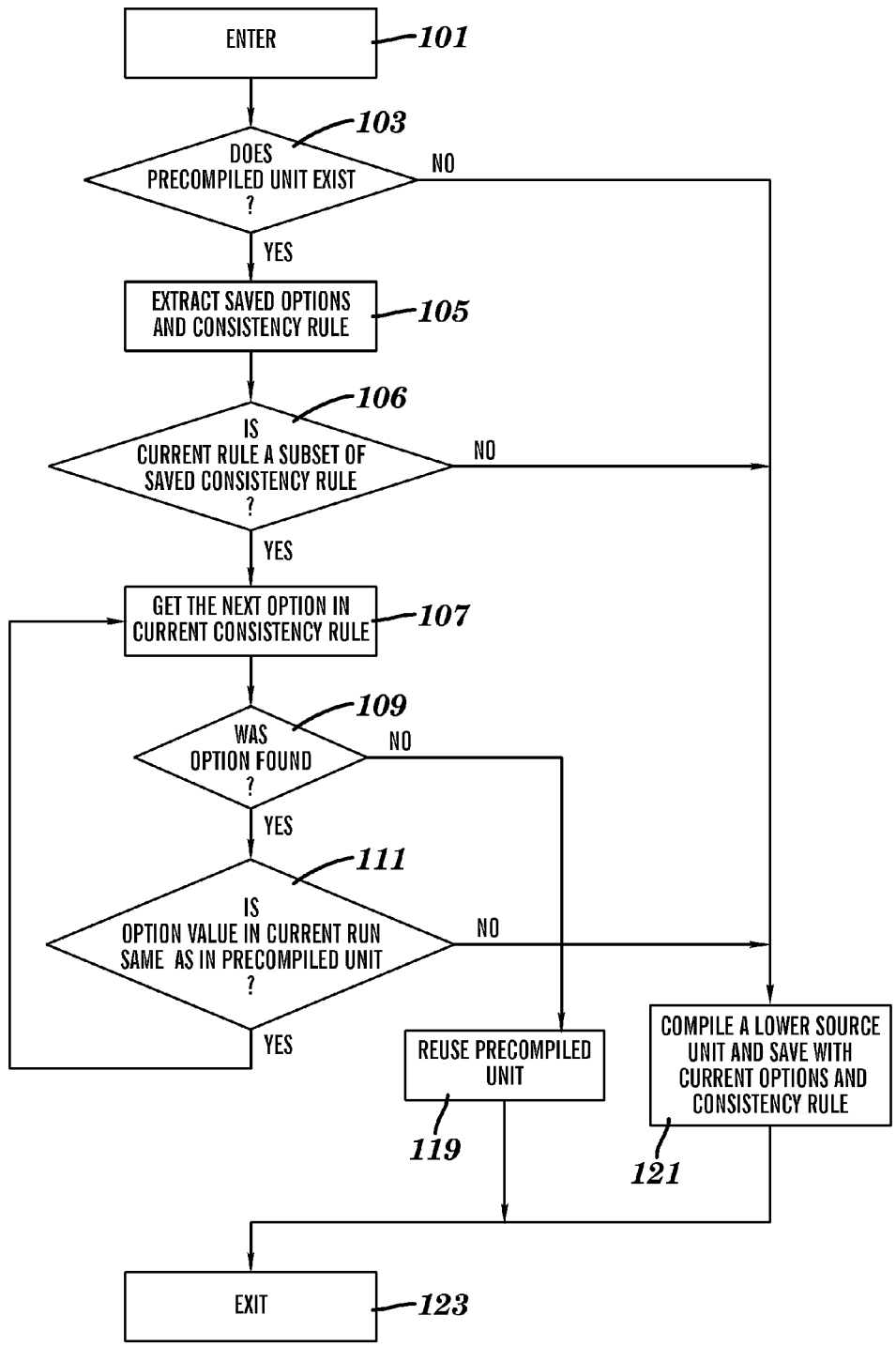
FIG. 1 illustrates a flow chart for the method, system, and program product of the invention.

These difficulties are obviated by the disclosed method, system, and program product for processing hardware design language code. The hardware design language code is characterized by the presence of consistency rules, including options and option values, in compiled code units. These consistency rules facilitate reuse of compiled code units by grouping options and option values to determine if code controlled by them can be and will be reused; and determining options and option values that controllably permit and prevent reuse of compiled code units. These options and option values may be user defined or pre-coded, and comprise options and option values that would permit reuse of compiled code units if previously compiled options are consistent with current option values, and prevent reuse of compiled code units if previously compiled options differ from current values.

In this invention, the proposed process for dealing with pre-compiled units consists of the following steps 1. Identify, and enumerate, all compiler options that can cause inconsistencies when combining results of compiler sessions made with a different setting. This list is provided by the compiler team or obtained by parsing the code. A subset of all of these options will be called a "consistency rule". A consistency rule represents those compiler options that must match during incremental compilation, while options not listed in a consistency rules are allowed to differ when different compilation units are compiled. The consistency rule is usually set per project basis.

The full set of the options identified in step I forms the strictest consistency rule, while the empty set forms a consistency rule allowing the compiler to combine pre-compiled compilation units regardless of the compiler options they were compiled with. Consistency rules can be hard-coded into the compiler, or user defined.

2. Add a new option to the compiler that designates a given consistency rule (either by listing the options in it, or by preassigned consistency rule names).

3. Whenever the result of compiling a compilation unit is saved also store the value of all compiler options that the compiler invoked with those that are included in the consistency rule given by the option added in step 2. For options that take no value, 1 can be stored to denote the presence of the option and 0 otherwise. Also store the consistency rule itself. The method of storing these data is left unspecified, but the compiler must be able to retrieve these values associated with the result of a previous compilation.

4. When the compiler has to decide if it can reuse a previously compiled compilation unit, it retrieves the consistency rule and compiler options used when compiling it previously. It shall reuse it if the stored consistency rule is stricter than the current rule, i.e. the current rule is a (not necessarily proper) subset of the stored rule.

all the compiler options contained in the current consistency rule are matching the values stored in the pre-compiled unit.

If it was decided not to reuse the previously compiled unit, due to failure to meet any of the two criteria in step 4 above, that unit will be recompiled and the current consistency rule as well as the current options will be stored in the pre-compiled unit. The result of following the above procedure is that pre-compiled units can be reused, thus saving compilation time, and at the same time the hierarchy of the design units is guaranteed to be consistent.

It is to be noted that it may be useful for certain applications to provide the capability to compile certain source files with the generated compiled units that bypass the consistency rule checks and are always reused. For example in a Hardware Description Language environment, the technology libraries are an excellent candidate for using such capability.

FIG. 1 illustrates a flow chart for one exemplification of our invention The method is entered 101 with candidate code, and a search is performed to determine if a precompiled unit exists 103. If no such precompiled unit or module exists, a lower source unit is compiled and saved with current options and consistency rules 121.

If however, a precompiled unit exists 103, saved options and consistency rule is extracted 105. The saved options and consistency rule is compared to the current consistency rules (entered in step 101), and if the current consistency rules are not a subset of the saved consistency rule 105 then, as in the absence of such rules, a lower source unit is compiled and saved with current options and consistency rules 121.

If current consistency rule is a subset of the saved consistency rule 105, the system searches for and retrieves the next option in the consistency rule 107. If no such option is found 109 the precompiled unit is reused 119. If however an option is found 109, the option value in the current run is compared to see if it is the same as the option in the precompiled unit 111. If not, a lower source unit is compiled and saved with current options and consistency rules 121. If, however the option value option value in the current run is the same as the option in the precompiled unit 111, the next option in the current consistency rule is recovered 107.

After selecting either compiling and saving a lower source unit with current options and consistency rules 121 or reusing the precompiled unit 119, the system is exited 123.

Figure 2:
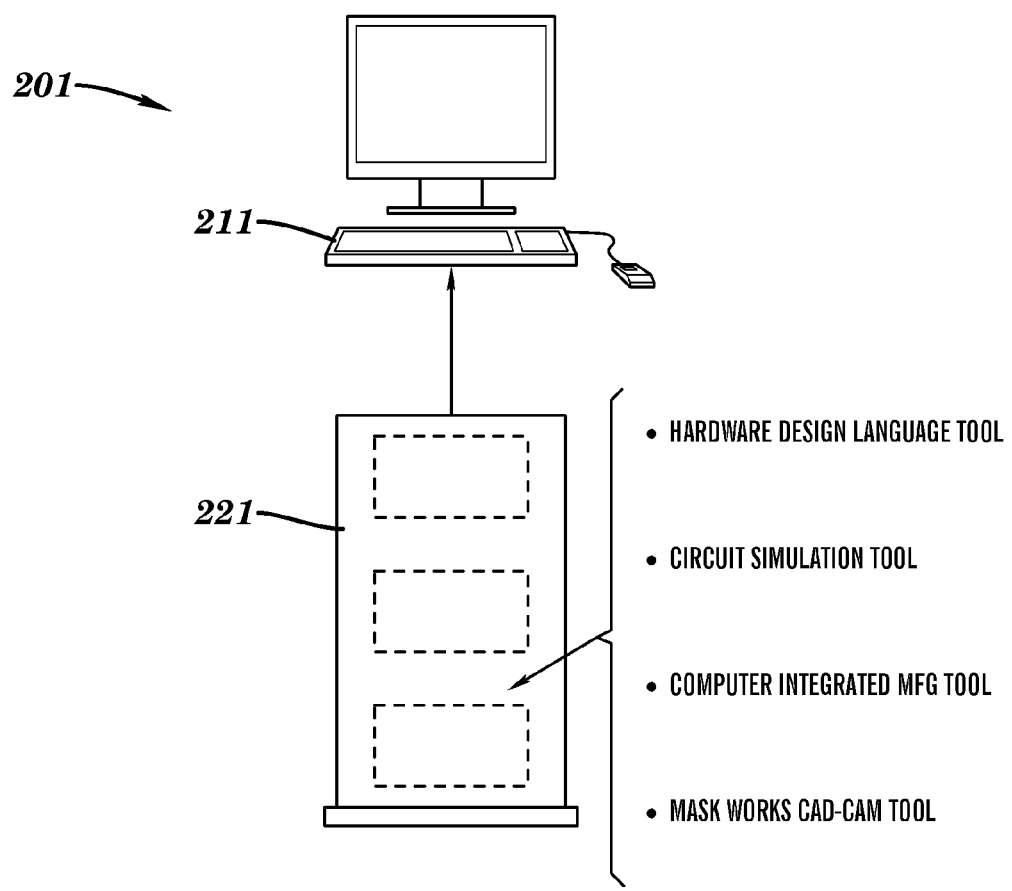
FIG. 2 illustrates a simplified diagram of the components of a design system including a user terminal and a server.

FIG. 2 illustrates one example of a system for practicing the method of the invention using the program product of the invention. The system 201 includes a user terminal 211, e.g., a work station, and an associated server 221, which may be connected directly or over a network. The associated server includes tools and applications such as (by way of exemplification and not limitation) a Hardware Design Language Tool, a Circuit Simulation Tool, a Computer Integrated Mfg Tool, and a Mask Works CAD—CAM Tool. Not shown are an operating system and system utilities, and links to associated equipment and fabrication tools may be included.

The invention may be implemented, for example, by having the system for compiler option consistency checking during incremental hardware design language compilation executing the method as a software application, in a dedicated processor or set of processors, or in a dedicated processor or dedicated processors with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for by having the system for compiler option consistency checking during incremental hardware design language compilation executing the method as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", JAVA, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method of providing compiler option consistency checking for an incremental compilation process, the method comprising:

receiving a candidate code unit at a compiler, the candidate code unit associated with a current consistency rule, the current consistency rule comprising current compiler options and corresponding current compiler option values;

accessing a saved precompiled code unit associated with the candidate code unit, the saved precompiled code unit associated with a saved consistency rule, the saved consistency rule comprising saved compiler options and corresponding saved compiler option values;

determining, at the compiler, prior to compiling or precompiling the candidate code unit, that the saved precompiled code unit can be reused for the candidate code unit, the determining comprising comparing the current consistency rule to the saved consistency rule;

compiling the candidate code unit and saving the candidate code unit with current compiler options and consistency rule based on determining that the current consistency rule is not a subset of the saved consistency rule; and reusing the saved precompiled code unit as part of an incremental compilation process performed by the compiler based on determining that the current consistency rule is a subset of the saved consistency rule, and that the current consistency rule has no additional options to process.

2. The method of claim 1 wherein at least one of the current consistency rule and the saved consistency rule is user defined.

3. The method of claim 1 wherein at least one of the current consistency rule and the saved consistency rule is pre-coded.

4. The method of claim 1 wherein it is determined that the saved precompiled code unit can be reused if all of the current compiler options are included in the saved compiler options and if the corresponding compiler option values in the current consistency rule and the saved consistency rule are the same.

5. The method of claim 1 further comprising:
determining that the saved precompiled code unit cannot be reused for the candidate code unit;
compiling the candidate code unit; and
storing the compiled candidate code unit and the current consistency rule.

6. A method of processing hardware design language code including options and option values in compiled code units to facilitate reuse of compiled code units comprising:
grouping compiler options and compiler option values to determine if compiled code units controlled thereby will be reused; and
determining the options and option values that would permit reuse of the compiled code units if previously compiled options for the compiled code units are consistent with current option values, and prevent reuse of the compiled code units if the previously compiled options differ from the current option values, the determining comprising:
entering candidate code into a compiler;
searching to determine if a precompiled code unit exists, and if no precompiled code unit exists, compiling a lower source unit and saving the lower source code unit with current options and consistency rules, and if a precompiled unit exists extracting saved options and consistency rule;
comparing saved options and consistency rules to the current consistency rules, and if the current consistency rules are not a subset of the saved consistency rules then compiling the lower source unit and saving the lower source unit with current options and consistency rules,
else searching for and retrieving a next option in the consistency rule;
if no next option is found reusing the precompiled unit;
else if a next option is found comparing an option value in the current run
if it is the same as the option in the precompiled unit, if not, compiling a lower source unit and saving the lower source unit with current options and consistency rule;
if, however the option value option value in the current run is the same as the option in the precompiled unit, recovering a next option in the current consistency rule.

7. A system for providing compiler option consistency checking for an incremental compilation process, the system comprising a processor configured to perform a method, the method comprising:
receiving a candidate code unit at a compiler, the candidate code unit associated with a current consistency rule, the current consistency rule comprising current compiler options and corresponding current compiler option values;
accessing a saved precompiled code unit associated with the candidate code unit, the saved precompiled code unit associated with a saved consistency rule, the saved consistency rule comprising saved compiler options and corresponding saved compiler option values;
determining prior to compiling or precompiling the candidate code unit, that the saved precompiled code unit can be reused for the candidate code unit, the determining comprising comparing the current consistency rule to the saved consistency rule;
compiling the candidate code unit and saving the candidate code unit with current compiler options and consistency rule based on determining that the current consistency rule is not a subset of the saved consistency rule; and
reusing the saved precompiled code unit as part of an incremental compilation process based on determining that the current consistency rule is a subset of the saved consistency rule, and that the current consistency rule has no additional options to process.

8. The system of claim 7 wherein at least one of the current consistency rule and the saved consistency rule is user defined.

9. The system of claim 7 wherein at least one of the current consistency rule and the saved consistency rule is pre-coded.

10. The system of claim 7 wherein the method determines that the saved precompiled code unit can be reused if all of the current compiler options are included in the saved compiler options and if the corresponding compiler option values in the current consistency rule and the saved consistency rule are the same.

11. The system of claim 7, wherein the method further comprises:
determining that the saved precompiled code unit cannot be reused for the candidate code unit;
compiling the candidate code unit; and
storing the compiled candidate code unit and the current consistency rule.

12. A computer program product for providing compiler option consistency checking for an incremental compilation process, the computer program product comprising:
a tangible storage medium readable by a processing circuit and storing instructions for execution by the processing circuit for performing a method comprising:
receiving a candidate code unit at a compiler, the candidate code unit associated with a current consistency rule, the current consistency rule comprising current compiler options and corresponding current compiler option values;
accessing a saved precompiled code unit associated with the candidate code unit, the saved precompiled code unit associated with a saved consistency rule, the saved consistency rule comprising saved compiler options and corresponding saved compiler option values,;

determining, at the compiler, prior to compiling or precompiling the candidate code unit, that the saved precompiled code unit can be reused for the candidate code unit, the determining comprising comparing the current consistency rule to the saved consistency rule;

compiling the candidate code unit and saving the candidate code unit with current compiler options and consistency rule based on determining that the current consistency rule is not a subset of the saved consistency rule; and reusing the saved precompiled code unit as part of an incremental compilation process performed by the compiler based on determining that the current consistency rule is a subset of the saved consistency rule, and that the current consistency rule has no additional options to process.

13. The computer program product of claim 12 wherein at least one of the current consistency rule and the saved consistency rule is user defined.

14. The computer program product of claim 12 wherein at least one of the current consistency rule and the save consistency rule is pre-coded.

15. The computer program product of claim 12 wherein it is determined that the saved precompiled code unit can be reused if all of the current compiler options are included in the saved compiler options and if the corresponding compiler option values in the current consistency rule and the saved consistency rule are the same.

16. The computer program product of claim 12 wherein the method further comprises:
 determining that the saved precompiled code unit cannot be reused for the candidate code unit;
 compiling the candidate code unit; and
 storing the compiled candidate code unit and the current consistency rule.

* * * * *